United States Patent
Yang

(10) Patent No.: US 7,709,280 B2
(45) Date of Patent: May 4, 2010

(54) SEMICONDUCTOR LASER WITH NARROW BEAM DIVERGENCE

(75) Inventor: Guowen Yang, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 121 days.

(21) Appl. No.: 12/141,847

(22) Filed: Jun. 18, 2008

(65) Prior Publication Data
US 2009/0011531 A1    Jan. 8, 2009

Related U.S. Application Data

(60) Provisional application No. 60/948,294, filed on Jul. 6, 2007.

(51) Int. Cl.
*H01L 29/06*    (2006.01)

(52) U.S. Cl. .............. 438/22; 438/29; 438/31; 438/38; 438/47; 257/E21.002

(58) Field of Classification Search .......... 438/22, 438/29, 31, 38, 47; 257/E21.002
See application file for complete search history.

(56) References Cited

U.S. PATENT DOCUMENTS

| | | | |
|---|---|---|---|
| 5,197,077 A | 3/1993 | Harding et al. | 372/45.01 |
| 5,815,521 A | 9/1998 | Hobson et al. | 372/45.01 |
| 6,040,590 A * | 3/2000 | OBrien et al. | 257/94 |
| 6,118,799 A | 9/2000 | Okubo et al. | 372/46.01 |
| 6,167,073 A | 12/2000 | Botez et al. | 372/46.01 |
| 6,522,677 B1 | 2/2003 | Petrescu-Prahova et al. | 372/45.01 |
| 6,650,671 B1 | 11/2003 | Garbuzov et al. | 372/45.01 |
| 6,724,795 B2 | 4/2004 | Reid | 372/45.01 |
| 6,882,670 B2 | 4/2005 | Buda et al. | 372/46.01 |
| 6,944,198 B2 | 9/2005 | Lovisa | 372/45.01 |
| 6,961,358 B2 | 11/2005 | Erbert et al. | 372/45.01 |
| 6,987,788 B2 | 1/2006 | Kim et al. | 372/45.01 |
| 7,085,299 B2 | 8/2006 | Lichtenstein et al. | 372/43.01 |
| 2003/0062528 A1* | 4/2003 | Yoshida et al. | 257/79 |
| 2005/0201437 A1 | 9/2005 | Reid et al. | 372/43.01 |

FOREIGN PATENT DOCUMENTS

WO    WO2007048110 A2    4/2007

OTHER PUBLICATIONS

G. Lin et al., "Extremely small vertical far-field angle of InGaAs-AlGaAs quantum well lasers with specially designed cladding structure", IEEE Photo. Tech. Lett., vol. 8, 1996, pp. 1588-1590.

M.C. Wu et al., "A periodic index separate confinement heterostructure quantum well laser", Appl. Phys. Lett., vol. 59, 1991, pp. 1046-1048.

S. T. Yen et al., "Theoretical investigation on semiconductor lasers with passive waveguides", IEEE J. Quantum Electron., vol. 32, 1996, pp. 4-13.

B. Corbett et al., "Engineering of InGaAsP layer structures for low divergence long wavelength lasers", Electron. Lett., vol. 38, 2002, pp. 515-516.

* cited by examiner

*Primary Examiner*—Thanh Nguyen
(74) *Attorney, Agent, or Firm*—Matthew A. Pequignot; Pequignot + Myers LLC

(57) ABSTRACT

The invention relates to a method of reducing vertical divergence of a high-power semiconductor laser with a negligible threshold current and conversion efficiency penalty. The low divergence is achieved by increasing the thickness of the n-cladding layer in an asymmetric laser diode stack structure, to a value ranging from 1 to 4 times the laser mode size measured at 10% level. The divergence may be tuned by adjusting the n-cladding layer parameters in an area of the tail the optical mode, measuring 0.03% or less of the maximal optical power density of said optical mode.

25 Claims, 6 Drawing Sheets

SEMICONDUCTOR LASER WITH NARROW BEAM DIVERGENCE

CROSS-REFERENCE TO RELATED APPLICATIONS

The present invention claims priority from U.S. Patent Application No. 60/948,294 filed Jul. 6, 2007, entitled "Semiconductor Laser With Narrow Divergent Output Beam", by Yang, which is incorporated herein by reference for all purposes.

TECHNICAL FIELD

The present invention relates to a method for effectively reducing the vertical far field divergence of a diode laser output beam without sacrificing other electro-optical performance parameters.

BACKGROUND OF THE INVENTION

High power semiconductor lasers are key components for many telecommunication and industrial applications. An important characteristic of a semiconductor laser is the divergence of its output beam. The lower the divergence, the easier it is to deliver the beam to a target, or to efficiently couple the beam into an optical fiber of a fiber-coupled semiconductor laser.

The output beam of a side-emitting semiconductor laser has more divergence in a vertical direction, i.e. in a direction perpendicular to the active layer plane, compared to the divergence in a horizontal direction, parallel to the active layer plane of a semiconductor laser. A more circular beam enables one to achieve more efficient coupling into an optical fiber. A small beam divergence angle can also improve the fiber alignment tolerance, which is important for maintaining coupling efficiency stability in the long term.

There have been many efforts to reduce the vertical far-field beam divergence of a semiconductor laser; however, most of them either were at lower output power, or resulted in poor performance, such as high threshold current or low slope efficiency.

Semiconductor lasers are typically based on p-n junctions of a p- and n-type semiconductor layers, which is why semiconductor lasers are frequently called laser diodes. The p-n junction of a laser diode is enhanced to facilitate the emission of photons due to recombination of electron-hole pairs. A well-known way to achieve such an enhancement is to add a new layer at the p-n junction, the new layer having a lower bandgap energy than p-type and n-type layers abutting it. The layer is commonly referred to as the active region of a semiconductor laser. An optical mode of the laser is primarily confined in the active region because of the difference in the index of refraction between the active region and the p- and n-doped layers. The active region provides gain to the optical mode when the p-n junction is forward-biased. The active region itself is often composed of many layers in order to tailor the performance of the laser to meet the requirements of a particular application.

One approach to reduce the vertical far-field divergence of a laser diode is to keep the layer structure symmetrical, and to design the layers so as to expand the optical mode in a direction perpendicular to the layer planes, thereby reducing the far-field divergence of emitted light in said direction. For example, in an article by G. Lin, S. Yen, C. Lee, and D. Liu entitled "Extremely low vertical far-field angle of InGaAs—AlGaAs quantum well lasers with specially designed cladding structure", IEEE Photo. Tech. Lett., vol. 8, pp. 1588-1590, 1996, the authors describe using two inserted low index layers between the active region and p- and n-cladding layers to expand the optical mode. In a U.S. Pat. No. 5,197,077 by Harding et al., a symmetrical layer structure of a laser diode is described consisting of triple graded-waveguide multi quantum wells, the center quantum well serving as a lasing region, and the other two quantum wells acting as optical trap layers for expanding the optical mode. Further, in an article by M. C. Wu, Y. K. Chen, M. Hong, J. P. Mannaerts, M. A. Chin, and A. M. Sergent, entitled "A periodic index separate confinement hetero-structure quantum well laser," Appl. Phys. Lett., vol. 59, pp. 1046-1048, 1991, the authors describe periodical super-lattice-like layers, introduced in the cladding layer of the symmetrical structure to effectively reduce the index contrast and expand the optical field, which reduced divergence of the beam in a direction perpendicular to the layer planes. Yet further, in an article by S. T. Yen and C. P. Lee entitled "Theoretical investigation on semiconductor lasers with passive waveguides," IEEE J. Quantum Electron., vol. 32, pp. 4-13, 1996, the authors investigate using two high index passive waveguides, inserted in the p and n-cladding layers to expand the light mode for smaller beam divergence. All the articles and patents mentioned in this paragraph are incorporated herein by reference.

The drawback of the approaches exploiting symmetrical structures is a higher ohmic resistance due to presence of multitude of mode-expanding layers, and higher optical loss due to expansion of the optical mode into n- and especially p-doped cladding layers.

High-power, long-cavity semiconductor lasers frequently use an asymmetric structure design, which has asymmetric optical mode distribution with more optical field in the n-side of the laser structure and less optical field in the p-side. The reason for shifting the optical mode towards the n-doped layer is that an optical loss in a laser diode mainly occurs in a p-cladding due to a much higher absorption coefficient in a p-doped material as compared to an n-doped material. For instance, in an article by B. Corbett, I. Kearney, P. Lambkin, J. Justice, U. Buckley, and K. Thomas, entitled "Engineering of InGaAsP layer structures for low divergence long wavelength lasers", Electron. Lett., vol. 38, pp. 515-516, 2002, the authors describe incorporating two high-index InGaAsP mode-pulling layers in the active region of a laser diode, for expanding and shifting the optical field towards the n-side of the p-n junction. Further, in a U.S. Pat. No. 6,882,670 by Buda et al., a diode laser is described, in which a refractive index profile of the layer stack is made asymmetric, so as to generate an optical field distribution skewed towards the n-type layers. The asymmetry is caused by a trap layer, located in n-cladding, for attracting the optical field, and a separation layer disposed between the active layer and the trap layer, for repelling the optical field. Yet further, in a U.S. Pat. No. 6,987,788 by Kim et al., a high power semiconductor laser device is described comprising p- and n-type cladding layers having the same refractivity, and additional high refractivity layer disposed in the n-type cladding layer, for pulling the majority of the optical mode towards the n-doped cladding. All the articles and patents mentioned in this paragraph are incorporated herein by reference.

The confinement factor is a measure of the overlap of the laser gain region with the optical mode of the optical waveguide. The asymmetric design effectively reduces the internal loss and enables longer cavity length designs; however, pushing more optical mode to the n-side has some drawbacks. One is that the confinement factor can be too low, which leads to a significantly higher threshold value that could in turn result in less reliable performance. Another problem is that pushing the optical field into the n-side can create a leaky mode into the substrate which can cause significant loss and other performance degradation, such as coherent interference with abnormal oscillating spectral behavior.

An important characteristic of a semiconductor laser is its beam parameter product defined as the far-field divergence multiplied by the near-field spot radius. The prior art approaches, relying on near-field mode expansion to reduce the far-field divergence, do not substantially improve the vertical beam parameter product of the output beam. A cylindrical microlens could be used to achieve a similar result. Reducing far-field divergence without having to expand the mode size is possible and, moreover, highly desirable; however, in order to achieve that, one would have to improve the quality of the laser beam itself. Further, with either designs, symmetric or asymmetric, it is difficult to tune the divergence of the output laser beam, so as to arrive at an optimized value of said divergence, due to a multitude of layers and deposition parameters involved. A method is required to control the far-field divergence and lower it, without a considerable near-field mode expansion, so as to improve the overall laser beam quality and ease the task of coupling the beam into an optical fiber.

It is, therefore, an object of the present invention to provide a method of manufacture of a semiconductor laser device having a high output optical power, of the order of 1 W, and a very low far field divergence, of the order of 12 to 20 degrees; a method allowing one to lessen the far field divergence of output radiation of said semiconductor laser device while keeping the optical loss and associated lasing threshold increase to a minimum. Surprisingly, the method of the present invention allows one to obtain an improvement of the overall laser beam quality as a result of considerable far-field divergence reduction, with a simple adjustment of only one process parameter.

SUMMARY OF THE INVENTION

Accordingly, the present invention relates to a method of manufacture of a high power semiconductor laser with reduced divergence of output radiation, comprising:

providing a semiconductor substrate; forming a stack of layers supported by the semiconductor substrate, comprising an active layer for generating light, and an n-doped and a p-doped cladding layers, wherein:

the active layer is disposed between the n-doped and the p-doped cladding layers, wherein the n-doped and the p-doped cladding layers have first and second refractive indices, respectively, and wherein the first refractive index is larger than the second refractive index; and wherein in operation, the stack of layers generates a lasing optical mode having a far field divergence and a peak point, wherein the stack of layers is asymmetric with respect to the active layer, so as to shift the majority of the lasing optical mode towards the n-doped cladding layer while keeping the peak point of the lasing optical mode inside the active layer;

the n-doped cladding layer includes an area of a tail of the lasing optical mode, wherein said tail has an optical power density of less than 0.03% of the optical power density at the peak point of the lasing optical mode, and wherein said area of the tail is characterized by a thickness and a refractive index; and the thickness of the area of the tail, or the refractive index of the area of the tail is adjusted so as to lessen the far field divergence of the lasing optical mode.

Another aspect of the present invention relates to a method of manufacture of a semiconductor laser with a reduced divergence of an output beam of light, comprising:

providing a semiconductor substrate; forming a stack of layers supported by the semiconductor substrate, comprising in relative sequence an n-type optical blocking layer abutting the semiconductor substrate, for preventing light from reaching the substrate, an n-type cladding layer for guiding light, an active layer, a p-type cladding layer for guiding light, and a p-type cap layer, wherein:

said active layer comprises a quantum well layer for generating light and a pair of guiding layers for guiding light, wherein the quantum well layer is disposed between the guiding layers;

each said layer of the stack has a refractive index, wherein the refractive index of the quantum well layer is larger the than the refractive index of the guiding layers; the refractive index of the guiding layers is larger than the refractive index of the n-type cladding layer and the p-type cladding layer; and the refractive index of the n-type cladding layer is larger than the refractive index of the p-type cladding layer and the n-type optical blocking layer;

each said layer of the stack has a thickness, wherein the thickness of the n-type cladding layer is greater than the thickness of the p-type cladding layer; and the thickness of the n-cladding layer is adjusted, so as to lessen the divergence of the output beam of light.

Another feature of the present invention provides a method of manufacturing a semiconductor laser, comprising:

a) providing a substrate;

b) growing an n-blocking layer over the substrate;

c) growing an n-cladding layer over a growth time, with a higher index than the n-blocking layer, over the n-blocking layer;

d) depositing an active region including a quantum well sandwiched by two waveguide layers, on the n-cladding layer;

e) depositing a p-cladding layer over the active region;

wherein step c) includes selecting a growth time from a plurality of growth times so as to obtain a best growth time which, in operation, results in the least vertical far-field divergence angle of an output laser beam.

BRIEF DESCRIPTION OF THE DRAWINGS

The invention will be described in a greater detail with reference to the accompanying drawings which represent preferred embodiments thereof, wherein.

DETAILED DESCRIPTION

The present invention relates to a semiconductor laser structure having a plurality of layers of differing refractive indices and thicknesses on a substrate including in relative sequence an n-blocking layer, an n-cladding layer, an active layer, a p-cladding layer, and a p-cap layer. The profile of the refractive indices of the layers across the structure is asymmetric. In the illustrated embodiment, the asymmetric structure is formed by using cladding layers of different refractive indices and thicknesses, but it can also be formed by other ways as long as the majority optical field is tilted to the n-side for low optical loss. The refractive index of the n-blocking layer is less than that of the n-cladding layer.

An aspect of the invention is the discovery that the vertical far-field divergence of the laser output beam decreases significantly and unexpectedly, e.g. from 20 to 13 degrees, whereas the confinement factor remains substantially constant, upon increasing the n-cladding layer thickness from 2 to 6 microns with all other parameters of the stack being the same. Thus the laser structure design provides a means for controlling the vertical divergence of the semiconductor laser without affecting other characteristics of the laser, such as lasing threshold or slope efficiency. The physical phenomenon underlying the invention is that laser structure allows the beam divergence to be controlled by keeping the peak of the mode profile fixed in the region of the active layer and varying only the tail of the mode profile.

Figure 1:
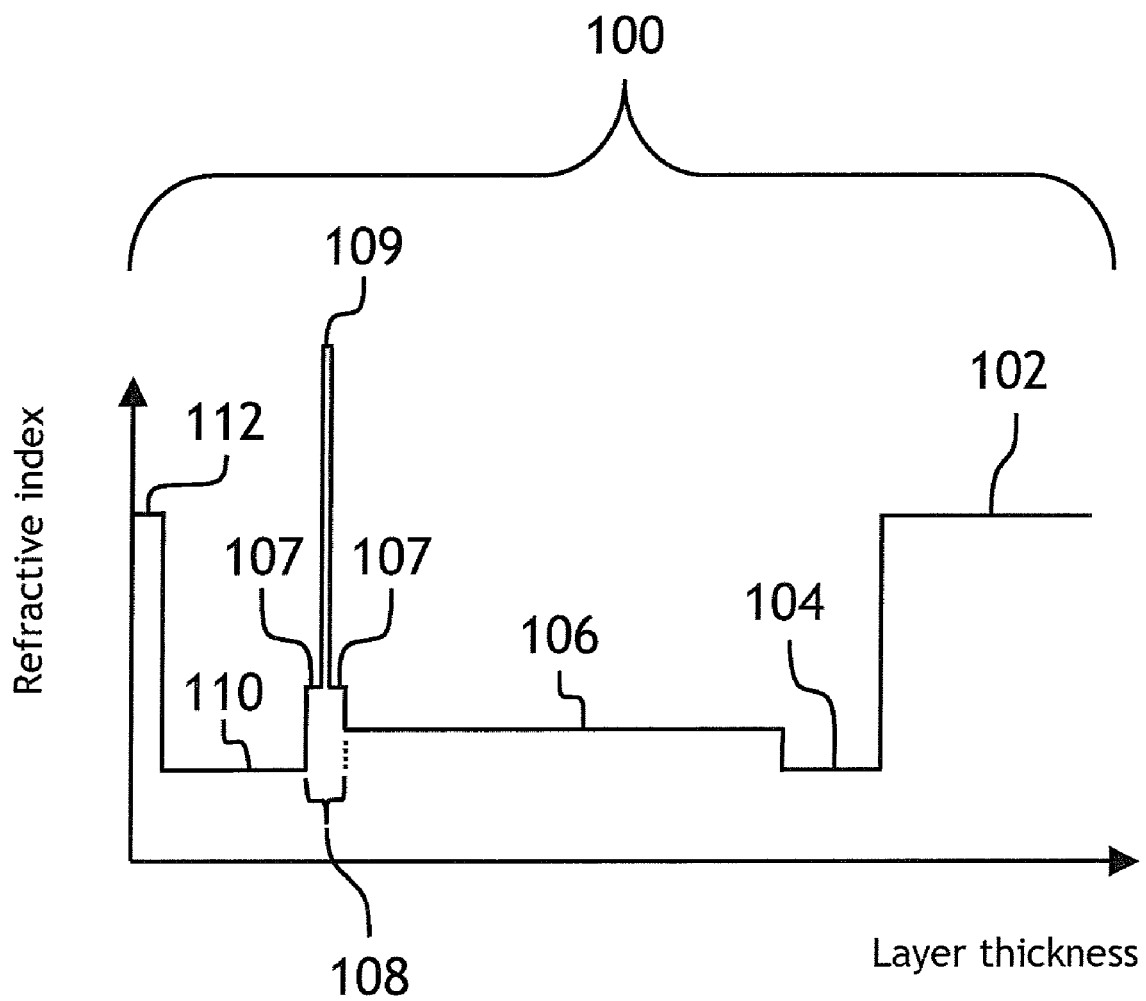
FIG. 1 is a refractive index map of the layers of the semiconductor laser according to the present invention.

The present invention relates to using a very small optical field tail to effectively reduce the vertical far-field divergence without any other adverse impacts. Turning to FIG. 1, a map of refractive indices of a laser diode stack 100 is shown illustrating a relative position, thicknesses, and associated refractive indices of various layers in the stack, including in sequence a n-substrate 102, an n-blocking layer 104, a n-cladding layer 106, an active region 108, a p-cladding layer 110, and a p-cap layer 112. Active region 108 consists of a quantum well 109 sandwiched between two guiding layers 107. In operation, a voltage is applied to layers 102 and 112, positive at layer 112, so as to make the main carriers in p- and n-doped cladding layers flow towards each other. The carriers, electrons and holes, recombine at the quantum well 109, emitting photons through the phenomenon of electroluminescence. The photons are guided by the waveguide formed by quantum well 109 and guiding layers 107 having a refractive index lower than that of quantum well 109. P- and n-doped cladding layers 110 and 106 are also a part of the waveguide structure since their indices of refraction are lower than those of quantum well 109 and guiding layers 107. Because the refractive index of n-cladding 106 is higher than the refractive index of p-cladding 110, the majority of the optical mode is tilted towards n-cladding 106 and n-substrate 102. In order to prevent leaking of the light into n-substrate 102 having a refractive index higher than that of n-cladding 106, n-blocking layer 104 is disposed between said layers 102 and 106. The thicknesses and refractive indices of layers 102-112 are chosen such that, even though the optical mode is tilted towards the n-substrate, the peak of the optical mode still resides in active region 108 so as to maximize the confinement factor defined above. Moreover, the refractive indices of said layers are chosen so that the peak of the optical mode stays within active region 108 at thicknesses of the n-cladding layer varying from 1.7 to 5.7 microns.

For InGaAs/AlGaAs 980 nm lasers, an exemplary method of manufacture is as follows. The semiconductor layers are grown by molecular beam epitaxy or metal oxide chemical vapor deposition. A buffer layer is grown onto an n-GaAs substrate to smooth the surface before a main laser structure is started. Then, n-blocking layer 104 is grown on the buffer layer, and n-cladding layer 106, having a higher refractive index than n-blocking layer 104, is grown over the layer 104. An active region 108, including a quantum well 109 sandwiched by two waveguide layers 107, is positioned over n-cladding layer 106. Then a p-cladding layer 110 and p-cap layer 112 for p-metal contact (not shown) are grown over the active region 108. By adding or decreasing the growth time of the lower n-cladding layer, i.e. by varying the resultant thickness thereof, the vertical far-field divergence angle (VFF) can be adjusted within a certain range. Ideally, the n-cladding layer is greater than 3 microns, more preferably between 3 microns and 6 microns to ensure VFF is under 17°, and most preferably between 4 microns and 6 microns to ensure VFF is between 13° and 17°. By increasing the degree of asymmetry, e.g. the difference in Aluminum content in the n-cladding layer compared to the p-cladding layer, VFF can also be adjusted, i.e. reduced. A 3% to 8% difference in Aluminum content is preferred.

After the epitaxial process, the device is fabricated through a series of process steps such as photolithography, metallization, coating, etc.

Figure 2:
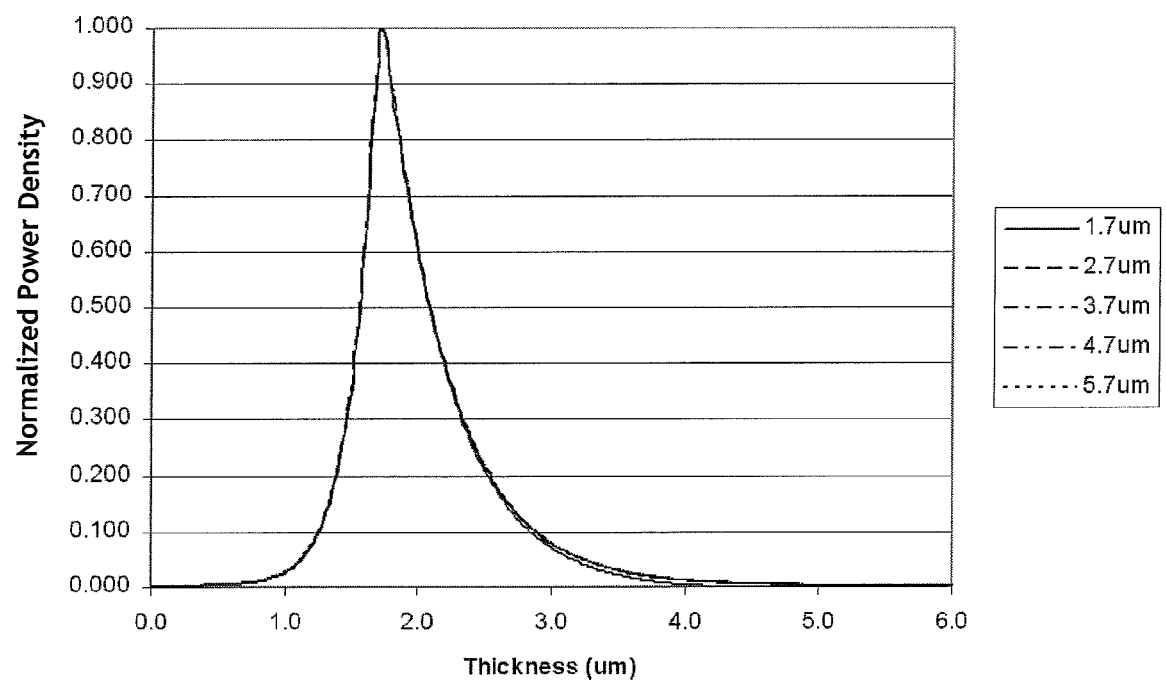
FIG. 2 is a near-field laser mode profile at a number of thickness values of the n-cladding layer.
Figure 3:
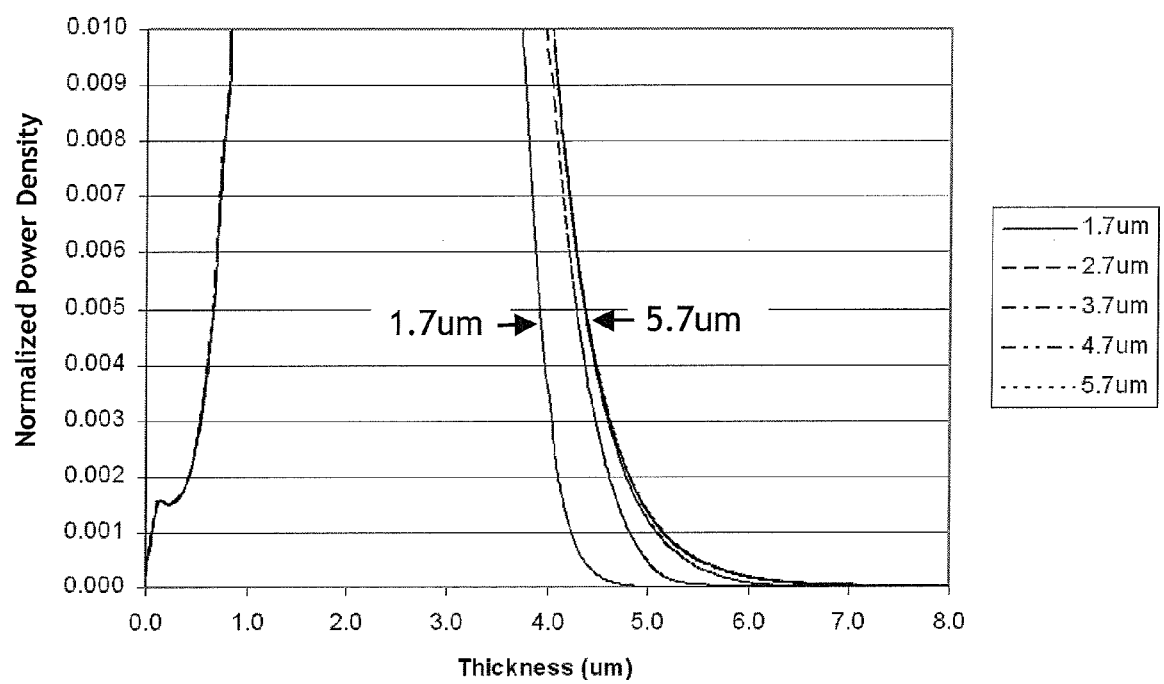
FIG. 3 is the same plot as FIG. 2, magnified to better illustrate dependence of a mode tail on the n-cladding layer thickness.

Turning now to FIG. 2, the optical field profile is shown at thicknesses of n-cladding 106 of FIG. 1 varying from 1.7 microns to 5.7 microns. As seen from FIG. 2, the center portion of the optical field, for example the optical field having an intensity of more than 10% of the maximum intensity, stays almost the same. Since it is this portion of the optical field that overlaps the active region, which determines the optical confinement factor and the value of threshold current, both these parameters stay almost the same upon varying the thickness of the n-cladding. The changes in optical field profile are better seen in FIG. 3 where the vertical scale is magnified by a factor of 100.

It appears that due to this small difference in the tail of the optical field, wherein the term "tail" means a region of the optical field with power density of the order of 0.03% and below, the vertical beam divergence angle can effectively be reduced by 4°-7°. Particularly, an increase of the n-side cladding layer thickness results in the tail of the optical field propagating further away from the peak of the optical field, which in turn decreases significantly the vertical far-field divergence.

Ideally, the p-cladding layer has a thickness of about 1.5 microns. Using a 10% mode size as a reference, e.g. 1.6 microns in the graph example for 10% mode size, and when the $1^{st}$ n-cladding layer thickness is designed to be 1×-4× this mode size, e.g. n-cladding layer thickness is 1.6 microns to 6.4 microns, the angle of vertical far-field divergence can be tailored at a desired value in a certain range without changing other key performance characteristics. When the n-cladding layer is 2 to 3 times larger than the 10% mode size, a low vertical far-field divergence can be achieved while maintaining good performance.

Figure 4:
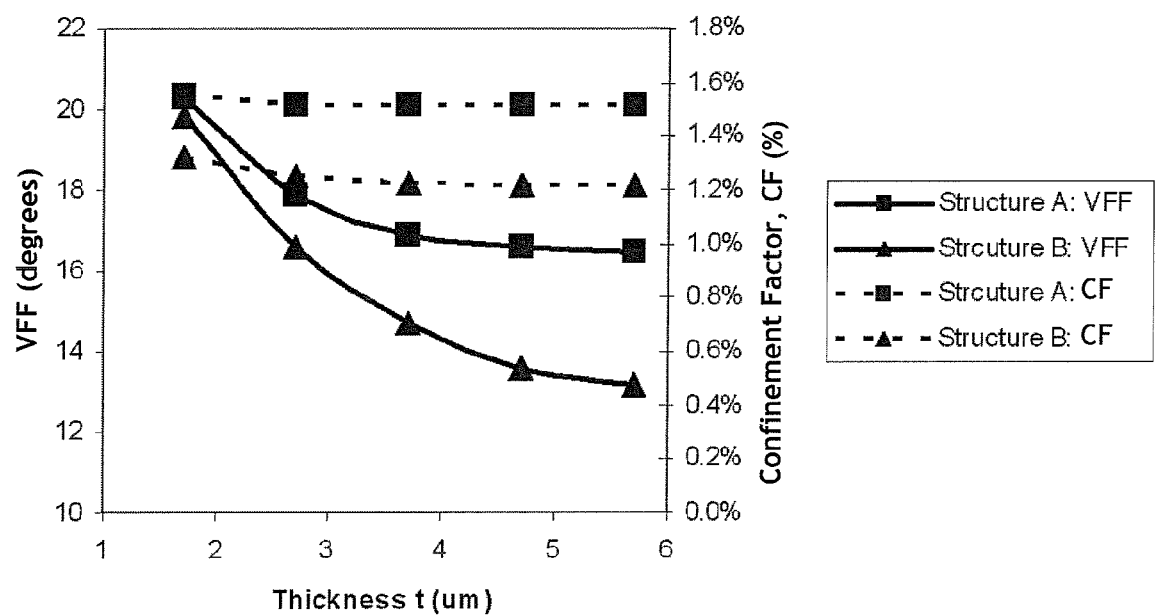
FIG. 4 is a plot of the vertical far-field divergence angle and the confinement factor vs. the n-cladding layer thickness of a semiconductor laser fabricated in accordance with the present invention.

Turning now to FIG. 4, results of a simulation are shown illustrating dependence of the confinement factor, CF, and the vertical far-field divergence angle, VFF, on the value of thickness of the n-cladding in two laser diode stack structures, Structure A and Structure B. Structure A is less asymmetric than structure B, i.e. structure A has a 4% difference in Aluminum content between the p- and n-cladding layers. Structure B is more asymmetric with a 6% difference in Aluminum content between the p- and n-cladding layers. It is seen from FIG. 4 that, upon increasing thickness t of the n-cladding layer from 1.7 to 5.7 microns, the confinement factor CF stays almost the same, while VFF changes considerably. For example, for structure A, the confinement factor changes by 0.03%, while the far-field divergence angle VFF changes by almost 4°. For structure B, which is more asymmetric than structure A, the confinement factor changes by 0.1%, while the far-field divergence angle VFF changes by over 6°. Accordingly, an increase in the asymmetry, e.g. an increase in the Aluminum content, e.g. 3% to 8% difference, can also lower VFF.

Lasers fabricated according to these designs show good agreement with the simulation data. In Table 1, experimental results showing effect of the clad thickness on laser parameters are also presented, side-by-side with the simulation results of FIG. 4.

Figure 5:
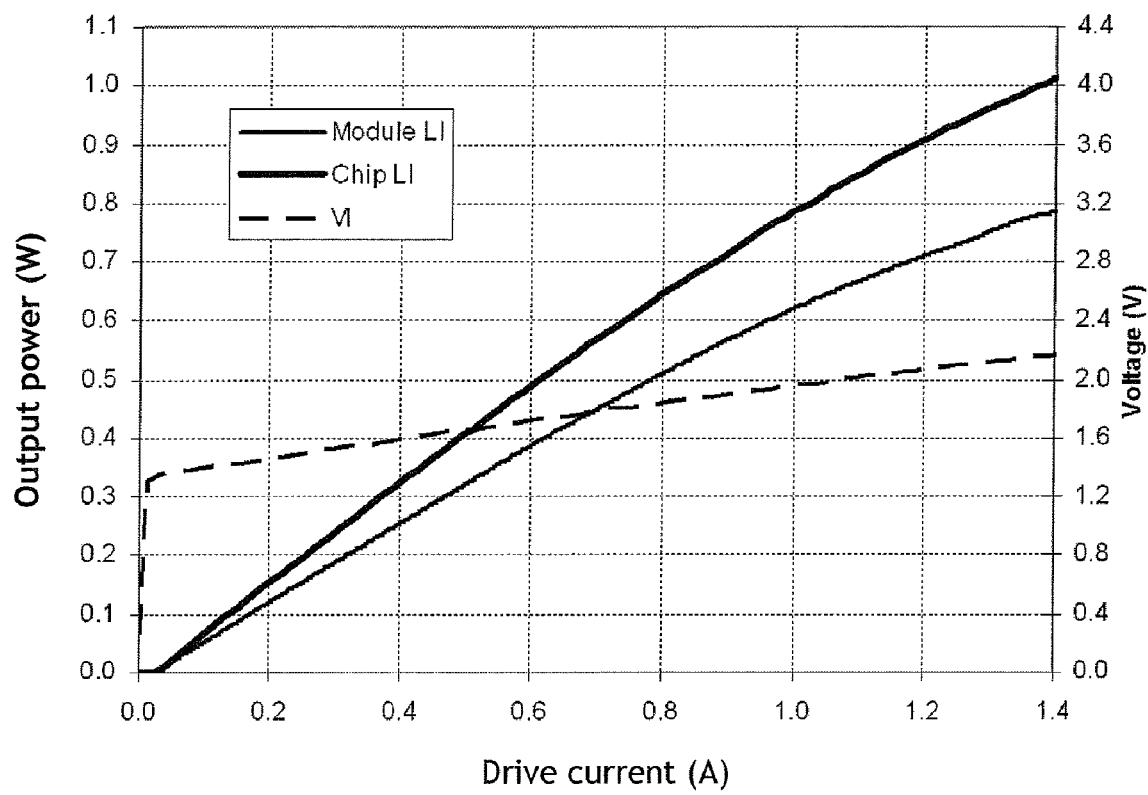
FIG. 5 is a plot of electro-optical characteristics of the laser according to the present invention.

Turning now to FIG. 5, the electro-optical performance of the fabricated laser diode chip with a high output power of 1 W is illustrated. The dependence of the diode chip output power on drive current is shown with a thick solid line. A thinner solid line in FIG. 5 denotes the fiber coupled output power as a function of the drive current. By comparing the two lines, a fiber coupling efficiency of 75% can be calculated. Finally, the dashed line in FIG. 5 shows the voltage-current characteristic of the fabricated laser diode chip.

Figure 6:
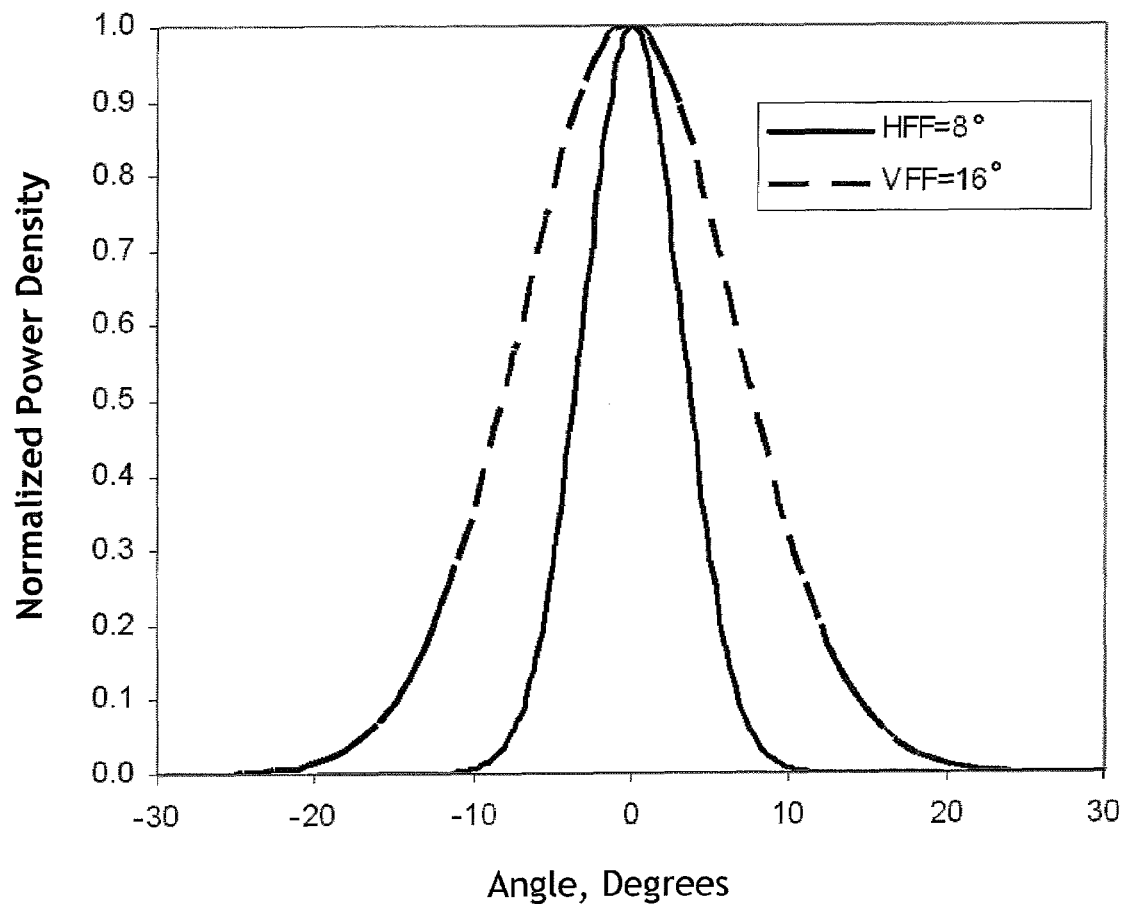
FIG. 6 is a plot of angular distribution of an output power density of the laser beam.

FIG. 6 shows the small vertical far-field angle of about 16° for this laser with structure code B-2 of Table 1.

The presented experimental and theoretical data prove the effect of the tail of the optical field on the vertical divergence of a laser diode. The n-cladding layer thickness can be increased to effectively reduce the vertical far-field divergence with no sacrifice to other parameters. However, it is understood that any method aiming to affect the small tail of less than 0.03% of maximum optical power density of a laser mode, is covered by the present invention. In a preferred embodiment, an asymmetric structure is implemented that pushes the optical field to the n-side of the laser stack, for low loss. Additionally and preferably, a low-index layer, disposed between the n-cladding and the n-substrate, is used to effectively prevent the optical field from penetrating into the substrate which can cause large losses due to leaking. For a material systems on a p-substrate, said low-index layer is disposed between the p-substrate and the p-cladding, the refractive index of the low-index layer being lower than that of the p-cladding.

TABLE 1

| Structure design | | Modeling and experimental results | | | | |
| --- | --- | --- | --- | --- | --- | --- |
| | | Modeling results | | Experimental | | |
| | Thickness t (um) | Confinement factor CF (%) | VFF (°) | Experimental VFF (°) | Threshold current | Structure Code |
| Asymmetric | 1.7 | 1.55% | 20.3° | 20.4° | 20.8 mA | A1 |
| structure A | 2.7 | 1.52% | 17.9° | 18.1° | 21.1 mA | A2 |
| | 3.7 | 1.52% | 16.9° | | | A3 |
| | 4.7 | 1.52% | 16.6° | | | A4 |
| | 5.7 | 1.52% | 16.5° | | | A5 |
| More | 1.7 | 1.32% | 19.8° | 18.9° | 24.8 mA | B1 |
| Asymmetric | 2.7 | 1.25% | 16.6° | 16.4° | 25.6 mA | B2 |
| structure B | 3.7 | 1.23% | 14.7° | | | B3 |
| | 4.7 | 1.22% | 13.6° | | | B4 |
| | 5.7 | 1.22% | 13.2° | | | B5 |

What is claimed is:

1. A method of manufacture of a high power semiconductor laser with reduced divergence of output radiation, comprising:
   providing a semiconductor substrate;
   forming a stack of layers supported by the semiconductor substrate, comprising an active layer for generating light, and an n-doped and a p-doped cladding layers, wherein:
      the active layer is disposed between the n-doped and the p-doped cladding layers, wherein the n-doped and the p-doped cladding layers have first and second refractive indices, respectively, and wherein the first refractive index is larger than the second refractive index; and wherein in operation, the stack of layers generates a lasing optical mode having a far field divergence and a peak point, wherein the stack of layers is asymmetric with respect to the active layer, so as to shift the majority of the lasing optical mode towards the n-doped cladding layer while keeping the peak point of the lasing optical mode inside the active layer;
      the n-doped cladding layer includes an area of a tail of the lasing optical mode, wherein said tail has an optical power density of less than 0.03% of the optical power density at the peak point of the lasing optical mode, and wherein said area of the tail is characterized by a thickness and a refractive index; and
   wherein the thickness of the area of the tail, or the refractive index of the area of the tail is adjusted so as to lessen the far field divergence of the lasing optical mode.

2. A method of manufacture of claim 1, wherein forming stack of layers further comprises forming a low-index layer having a third refractive index, wherein the low-index layer is formed on the semiconductor substrate, and the n-doped cladding layer is formed on the low-index layer, and the third refractive index is smaller than the first refractive index.

3. A method of manufacture of claim 1, wherein forming stack of layers further comprises forming a low-index layer having a third refractive index, wherein the low-index layer is formed on the semiconductor substrate, and the p-doped cladding layer is formed on the low-index layer, and the third refractive index is smaller than the second refractive index.

4. A method of manufacture of claim 1, wherein the semiconductor substrate is a GaAs substrate, and the n-doped and the p-doped cladding layers are AlGaAs layers having respective Al concentrations differing by 3% to 8%.

5. A method of manufacture of claim 1, wherein:
   the lasing optical mode is characterized by a mode size measured at 10% of the optical power density at the peak point of the mode;
   the n-doped layer has a thickness; and
   the ratio of the thickness of the n-doped cladding layer to the mode size is between one and four.

6. A method of manufacture of claim 1, wherein:
   the lasing optical mode is characterized by a mode size measured at 10% of the optical power density at the peak point of the mode;
   the n-doped cladding layer has a thickness; and
   the ratio of the thickness of the n-doped cladding layer to the mode size is between two and three.

7. A method of manufacture of claim 1, wherein the n-doped cladding layer has a thickness of between 1.7 and 5.7 microns.

8. A method of manufacture of claim 7, wherein, upon manufacturing two semiconductor lasers differing only by the n-cladding layer thicknesses, wherein the thicknesses are 1.7 and 5.7 microns, and upon energizing each of said laser diodes with a same power source, the far-field divergence of the lasing optical modes of the two lasers differs by at least 3.5 degrees.

9. A method of manufacture of claim 7, wherein, upon manufacturing two semiconductor lasers differing only by the n-cladding layer thicknesses, wherein the thicknesses are 1.7 and 4.7 microns, and upon energizing each of said laser diodes with a same power source, the far-field divergence of the lasing optical modes of the two lasers differs by at least 5.2 degrees.

10. A method of manufacture of a semiconductor laser with a reduced divergence of an output beam of light, comprising:
    providing a semiconductor substrate;
    forming a stack of layers supported by the semiconductor substrate, comprising in relative sequence an n-type optical blocking layer abutting the semiconductor substrate, for preventing light from reaching the substrate, an n-type cladding layer for guiding light, an active layer, a p-type cladding layer for guiding light, and a p-type cap layer, wherein:
       said active layer comprises a quantum well layer for generating light and a pair of guiding layers for guiding light, wherein the quantum well layer is disposed between the guiding layers;
       each said layer of the stack has a refractive index, wherein
          the refractive index of the quantum well layer is larger the than the refractive index of the guiding layers;
          the refractive index of the guiding layers is larger than the refractive index of the n-type cladding layer and the p-type cladding layer; and
          the refractive index of the n-type cladding layer is larger than the refractive index of the p-type cladding layer and the n-type optical blocking layer;
       each said layer of the stack has a thickness, wherein the thickness of the n-type cladding layer is greater than the thickness of the p-type cladding layer; and
    the thickness of the n-cladding layer is adjusted, so as to lessen the divergence of the output beam of light.

11. A method of manufacture of claim 10, wherein the semiconductor substrate is a GaAs substrate, and the n-type cladding layer and the p-type cladding layer are AlGaAs layers having respective Al concentrations differing by 3% to 8%.

12. A method of manufacture of claim 10, wherein:
    in operation, the stack of layers generates a lasing optical mode having a mode size measured at 10% of a maximum of the mode; and
    the ratio of the thickness of the n-type cladding layer to the mode size is between one and four.

13. A method of manufacture of claim 10, wherein:
    in operation, the stack of layers generates a lasing optical mode having a mode size measured at 10% of a maximum of the mode; and
    the ratio of the thickness of the n-type cladding layer to the mode size is between two and three.

14. A method of manufacture of claim 10, wherein the n-type cladding layer has a thickness of between 1.7 and 5.7 microns.

15. A method of manufacture of claim 14, wherein, upon manufacturing two semiconductor lasers differing only by the n-cladding layer thicknesses, wherein the thicknesses are 2.7 and 5.7 microns, and energizing two said laser diodes in a substantially identical fashion, the far-field divergence of the lasing optical modes of the two lasers differs by more than 3.2 degrees.

16. A method of manufacturing a semiconductor laser, comprising:
  a) providing a substrate;
  b) growing an n-blocking layer over the substrate;
  c) growing an n-cladding layer over a growth time, with a higher index than the n-blocking layer, over the n-blocking layer;
  d) depositing an active region including a quantum well sandwiched by two waveguide layers, on the n-cladding layer;
  e) depositing a p-cladding layer over the active region;
  wherein step c) includes selecting a growth time from a plurality of growth times so as to obtain a best growth time which, in operation, results in the least vertical far-field divergence angle (VFF) of an output laser beam.

17. The method according to claim 16, wherein step c) includes growing the n-cladding layer between 3 microns and 6 microns to provide VFF of less than 17°.

18. The method according to claim 16, wherein step c) includes growing the n-cladding layer between 4 microns and 6 microns to provide VFF of between 13° and 17°.

19. The method according to claim 16, wherein, upon adjusting the growth time of the n-cladding layer so as to increase the n-cladding layer thickness from 1.7 microns to 4.7 microns, VFF reduces by at least 3.7 degrees.

20. The method according to claim 16, wherein, upon adjusting the growth time of the n-cladding layer so as to increase the n-cladding layer thickness from 1.7 microns to 4.7 microns, VFF reduces by at least 5.2 degrees.

21. The method according to claim 16, further comprising growing a buffer layer onto the substrate to smooth the surface before growing the n-blocking layer.

22. The method according to claim 16, further comprising providing a p-cap layer over the p-cladding layer, for a p-metal contact.

23. The method according to claim 16, wherein step e), or step c), or both, include adjusting an Aluminum content difference between the p-cladding layer and the n-cladding layer, from between 3% to 8% more Aluminum in the p-cladding layer than in the n-cladding layer, to provide a desired asymmetry between the n-cladding layer and the p-cladding layer and obtain the desired VFF.

24. The method according to claim 23, wherein, upon adjusting an Aluminum content difference from between 4% to 6% more Aluminum in the p-cladding layer than in the n-cladding layer, VFF reduces by at least 3 degrees.

25. The method according to claim 23, wherein, upon adjusting an Aluminum content difference from between 4% to 6% more Aluminum in the p-cladding layer than in the n-cladding layer, and upon adjusting the growth time of the n-cladding layer so as to increase the n-cladding layer thickness from 1.7 microns to 5.7 microns, VFF reduces by at least 7 degrees.

* * * * *